(12) United States Patent
Vega

(10) Patent No.: US 10,776,528 B1
(45) Date of Patent: Sep. 15, 2020

(54) SYSTEMS AND METHODS FOR SMART HOME MAPPING

(71) Applicant: Vivint, Inc., Provo, UT (US)

(72) Inventor: JonPaul Vega, Highland, UT (US)

(73) Assignee: Vivint, Inc., Provo, UT (US)

(*) Notice: Subject to any disclaimer, the term of this patent is extended or adjusted under 35 U.S.C. 154(b) by 0 days.

(21) Appl. No.: 16/423,914

(22) Filed: May 28, 2019

Related U.S. Application Data

(63) Continuation of application No. 14/543,019, filed on Nov. 17, 2014, now Pat. No. 10,303,813.

(51) Int. Cl.
  *G06F 17/50* (2006.01)
  *G06F 30/13* (2020.01)

(52) U.S. Cl.
  CPC ................... *G06F 30/13* (2020.01)

(58) Field of Classification Search
  CPC .................................................. G06F 17/5004
  USPC ............................................................. 703/1
  See application file for complete search history.

(56) References Cited

U.S. PATENT DOCUMENTS

| | | |
|---|---|---|
| 8,788,448 B2 | 7/2014 | Fadell et al. |
| 2014/0266669 A1 | 9/2014 | Fadell et al. |
| 2015/0327010 A1 | 11/2015 | Gottschalk et al. |

*Primary Examiner* — Timothy A Mudrick
(74) *Attorney, Agent, or Firm* — Holland & Hart, LLP

(57) ABSTRACT

Methods and systems are described for mapping a living space. An example computer-implemented method for mapping a living space includes receiving information about an exterior perimeter of the living space, receiving information about a plurality of interior boundaries of the living space, receiving information about a location for each of a plurality of barriers of the living space, and generating an electronic map of the living space using the information about the exterior perimeter, the plurality of interior boundaries, and the location of each of the plurality of barriers.

20 Claims, 12 Drawing Sheets

SYSTEMS AND METHODS FOR SMART HOME MAPPING

CROSS REFERENCE

The present application us a continuation of U.S. patent application Ser. No. 14/543,019, filed Nov. 17, 2014, titled "SYSTEMS AND METHODS FOR SMART HOME MAPPING", and assigned to the assignee hereof, the disclosure of this reference is incorporated herein in their entirety by this reference.

BACKGROUND

Advancements in media delivery systems and media-related technologies continue to increase at a rapid pace. Increasing demand for media has influenced the advances made to media-related technologies. Computer systems have increasingly become an integral part of the media-related technologies. Computer systems may be used to carry out several media-related functions. The wide-spread access to media has been accelerated by the increased use of computer networks, including the Internet and cloud networking.

Many homes and businesses use one or more computer networks to generate, deliver, and receive data and information between the various computers connected to computer networks. Users of computer technologies continue to demand increased access to information and an increase in the efficiency of these technologies. Improving the efficiency of computer technologies is desirable to those who use and rely on computers.

With the wide-spread use of computers and mobile devices has come an increased presence of home automation and security products. Advancements in mobile devices allow users to monitor and/or control an aspect of a home or business. As home automation and security products expand to encompass other systems and functionality in the home, opportunities exist for improved placement and control of automation and security equipment locally and remotely.

SUMMARY

Methods and systems are described for mapping a living space. An example computer-implemented method for mapping a living space includes receiving information about an exterior perimeter of the living space, receiving information about a plurality of interior boundaries of the living space, receiving information about a location for each of a plurality of barriers of the living space, and generating an electronic map of the living space using the information about the exterior perimeter, the plurality of interior boundaries, and the location of each of the plurality of barriers.

In one example, the information about the exterior perimeter, the plurality of interior boundaries, and the location of each of the plurality of barriers is received from a handheld mobile computing device. The information about the plurality of interior boundaries may include three-dimensional information about each of the plurality of interior boundaries. The information about the location for each of the plurality of barriers may include a position for each of the plurality of barriers along the plurality of interior boundaries. The plurality of barriers may include doors and windows. The plurality of interior boundaries may include interior walls of the living space. The living space may be a home, the exterior perimeter may include exterior walls of the home, and the plurality of interior boundaries may be interior walls defining rooms of the home. The method may include generating recommended automation features, or security features, or a combination thereof, based on the electronic map of the living space.

Another embodiment is directed to an apparatus for mapping a living space. The apparatus includes a processor, a memory in electronic communication with the processor, and instructions stored in the memory. The instructions are executable by the processor to collect an exterior perimeter measurement of the living space, receive an indicator of an entrance to the living space, collect interior measurements for the living space, receive a location indicator for each of a plurality of doors and windows in the living space, and generate an electronic map of the living space.

In one example, the electronic map may be a three-dimensional map of the living space. The instructions may be executable by the processor to generate recommended security and automation features for the living space based on the electronic map. The apparatus may be a handheld computing device configured to be carried by a user during the collecting and receiving steps.

A further embodiment is directed to an electronic mapping system that includes a handheld computing device and a computer-aided design system. The handheld computing device is configured to collect an exterior perimeter measurement of a home, collect interior measurements for the home, and generate a location indicator for each of a plurality of doors and windows in the home. The computer-aided design system is configured to receive the exterior perimeter measurement, the interior measurements, and the location indicator from the handheld computing device, and generate an electronic map of the home.

In one example, the electronic map may be a three-dimensional model of the living space. The handheld computing device may be configured to be carried by a user when collecting the exterior perimeter measurement, the interior measurements, and the location indicator. The handheld computing device may be further configured to generate recommendations for at least one of an automation feature and a security feature for the home based on the electronic map. The recommendations may include a location for the at least one of the automation feature and the security feature. The handheld computing device may be further configured to display the electronic map. The electronic map may be displayed as at least one of a two-dimensional map and a three-dimensional map. The handheld computing device may be further configured to take a photograph of at least one portion of the home, the photograph being associated with the electronic map.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the embodiments may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

Figure 1:
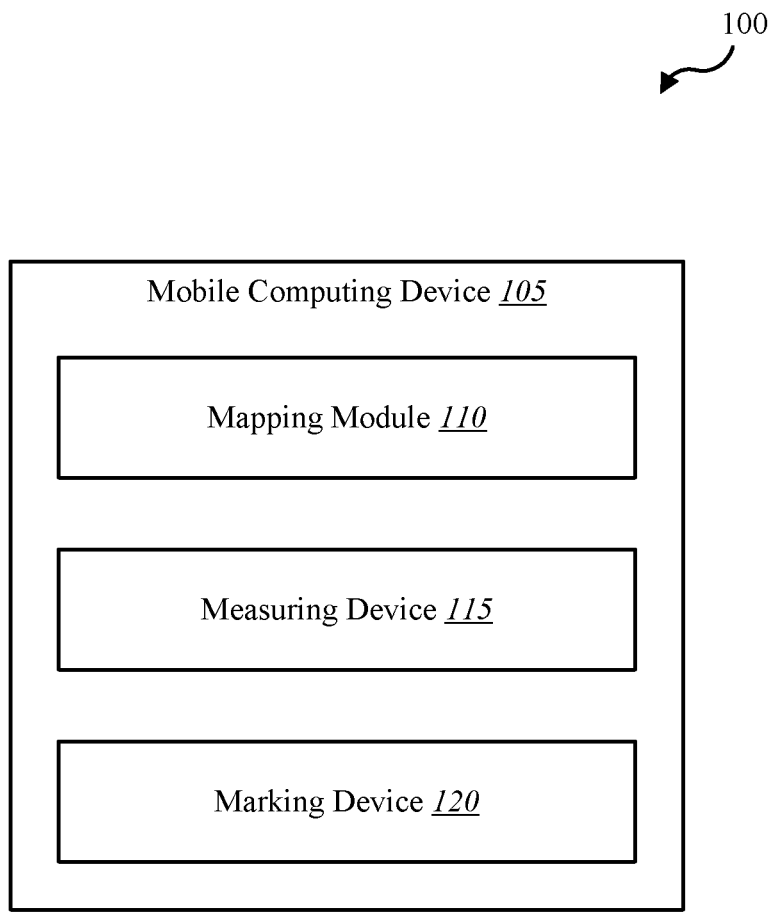
FIG. 1 is a block diagram of an environment in which the present systems and methods may be implemented.

While the embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

The systems and methods described herein may, at least in part, relate to home automation and home security, and related security systems and automation for use in commercial and business settings. As used herein, the phrase "home automation system" may refer to a system that includes automation features alone, security features alone, a combination of automation and security features, or a combination of automation, security and other features. While the phrase "home automation system" is used throughout to describe a system or components of a system or environment in which aspects of the present disclosure are described, such an automation system and its related features (whether automation and/or security features) may be generally applicable to other properties such as businesses and commercial properties as well as systems that are used in indoor and outdoor settings. The systems and methods described may have other applications outside of home automation systems, such as applications in the real estate market.

When setting up an automation and security system on a property (e.g., a home) it is often difficult to capture information about the exact location of the equipment for the system. Specifically, there is no definitive location for where the components lie within the property. This lack of understanding may lead to challenges when communicating between sales personnel and installers, and later communications between call centers and homeowners in the event of alarms and/or false alarms, or between a call center or homeowner and maintenance personnel. For example, a homeowner's request for a glass break sensor on a specific master bedroom window prior to installation may not result in proper installation when there are 3 to 5 windows in the master bedroom where the glass break sensor could be installed. After installation, if the glass break sensor in the master bedroom window is activated, the call center may have difficulty helping the homeowner or technician understand where the sensor is located to confirm whether an actual alarm event has occurred as compared to a false alarm when there are multiple windows where the "master bedroom window sensor" may be located. Maintaining and/or repairing equipment can also be difficult when the less than precise information about location on the property for components of the system is known.

The present systems and methods may provide multiple levels of logic and/or information that assist in identifying the environment, identifying what components of the system are to be installed in the environment, identifying where and when the components are installed in the environment, and later identifying intent of users in the environment for purposes of automated or recommended control of the system. The first level of identifying the environment may include creating a home layout that may be used by salespersons, installers, call center personnel, and the homeowner as part of laying out, installing, identifying, and/or maintaining components of an automation system. The home layout may be established using a standard system that measures and quantitatively captures variability in the home layout.

In one embodiment, the home layout may be established using a layout device (also referred to herein as a mapping device). The layout device may include a plurality of lasers (e.g., five laser diodes). The lasers may capture measurements in X and Y axis directions. Optionally, the layout device may also capture measurements in a Z axis direction. In one example, the layout device includes four laser diodes used to capture distances in the X and Y axis directions, and any fifth laser diode captures measurements in the Z axis direction, wherein the X and Z axes are in a horizontal plane and the Y axis is in a vertical plane. The layout device may include a gyroscope to confirm proper orientation of the layout device relative to the horizontal and vertical planes. The layout device may include a pedometer used to measure distance. In some examples, the layout device includes a GPS device that may assist in measuring horizontal and vertical distances (e.g., for layouts of different floors of a given house).

The layout device may be capable of transmitting and receiving measurement data. In one example, the layout device may be connected to and carried by a portable computing device such as, for example, a smart phone, tablet computer, lap top computer, or the like. The layout device may be paired to the portable computing device via, for example, BlueTooth. The layout device may communicate with a remote computing system via, for example, a network such as a cellular network.

The measurements collected by the layout device may be used to generate an electronic map or layout of the property (e.g., home). The layout may be generated by the layout device. Alternatively, the measurements collected by the layout device may be transmitted to another computing device that generates the layout. In one example, the system used to generate the layout is a computer assisted design (CAD) system that generates the layout in at least one of two-dimension (2-D) and three-dimension (3-D) format.

An example method in accordance with the present disclosure related to mapping of a property (e.g., a home) begins with a technician making a perimeter measurement at the property. The technician may stand, for example, at a front door of the property, record the house orientation, and initiate measurement using the layout device. The technician may walk around the perimeter of the property to the best of his ability, ending up at the front door again. This perimeter calculation may provide both a perimeter and an area of the property. Various technologies may be used to provide the perimeter measurement including, for example, GPS, lasers, and/or a pedometer in combination with direction of travel input.

The technician may then walk inside the property and initiate another measurement process (e.g., using a plurality of laser diodes). The technician may walk the layout of the main floor first, pausing at the entrance to each new room and recording starting interval location and ending interval location. The technician may record or mark the designated location for each exterior door, interior door, window, stairwell, and other landmarks within a property. The process would be repeated for each floor of the property.

The measurements collected by the layout device could be processed on the layout device to generate a layout or electronic map for each floor. Additionally, or alternatively, the measurements could be transmitted to a remote service such as a central server or third party provider that generates the layout or electronic map. The layout may be in the form of a 2-D map. Additionally, or alternatively, the layout may be in the form of a 3-D layout or map, which may be referred to as a 3-D rendering of the property. The layout may include a changeable naming convention in which the doors, windows, stairwells, rooms, and the like may be named or renamed at any point.

The technician may then ask the customer where they would like to place the control panel for the home automation system. The technician may initiate another measurement, which may include walking to the most direct perimeter point of the home from the panel location. The reference point may be created for the panel inside the home layout.

The technician may then collect information from the customer such as, for example, pets, number of people in the household, ages and activity level of those in the household, special instructions, preferences, and the like. This information may be entered into the layout device. The layout device may generate recommendations based on selected services (e.g., full home automation and security, security only, etc.). The recommendations may include suggested equipment layout. The recommendation may be modified based on, for example, increasing or decreasing upfront costs, desired level of automation and/or security, and the like.

The technician may then adjust the naming convention of the layout as needed for installing the equipment selected and/or approved by the customer. The layout with the selected equipment layout may be integrated or otherwise provided together (e.g., for an installer) along with instructions related to the equipment. Installer may return to the property at any time to make the installation based on the property layout and equipment layout along with the naming conventions applied by the technician and/or customer.

Another aspect of the present disclosure relates to how the layout map, inclusive of the equipment layout, may be used for improved communications and control of the home automation system. In one example, the layout is visible on the control panel of the home automation system. When equipment signals are sent to the control panel, the location of the equipment may be identified on the layout/map for viewing by the user. The user may then have a more clear understanding of the location of the equipment when going to check on the equipment and/or area being monitored by the equipment. Additionally, the user may be able to communicate information about the equipment and/or alarm generated in response to the equipment signals when, for example, the central service contacts the user.

In another example, the layout is visible on a mobile application carried on a handheld computing device or remote computing device accessible to the user. The mobile application may permit viewing of alarms, alerts, notifications or rules based on specific location information available on the layout. The layout may include, as mentioned above, 2-D or 3-D images of the property or portions thereof.

In a still further example, the layout is used during alarm events so that the monitoring agents at the central service can provide more accurate descriptions of alarms to customers and dispatchers. The alarm process may also leverage human decision making based on the layout of the home and where triggered and non-triggered sensors and other equipment are located.

Another application for the layout relates to building rules and logic surrounding patterns of entry and exit based on the layout and where the equipment/devices are placed on the property. Knowing the perimeter/area of the house may also be used for enabling identification of users with identifying devices (e.g., cell phones or other handheld mobile communication devices). For example, a user carrying a smart phone that is connected to WiFi within the perimeter of the property may trigger rules or logic based on patterns of behavior of the user within the property. In one example, a person carrying a particular identifying device may always turn off certain lights at a certain time of day or may lock or unlock a certain door or control other security and/or automation features at a certain time or day of the week. These patterns of behavior, with added clarity of detail provided by the layout of the property and location of equipment of the home automation system, may make it possible to automatically operate certain features in the property depending on, for example, time of day, day of week, or location of the user within the property or away from the property.

Another option possible in accordance with the present disclosure is to add photographs of the system equipment, rooms, barriers or landmark features on the property to the layout. The photographs may then be made available as part of identifying and/or communicating information about operation of the equipment, alarms being generated, and the like for purposes of maintenance, first responders, home owners, and the like.

FIG. 1 is a block diagram illustrating one embodiment of an environment 100 in which the present systems and methods may be implemented. In some embodiments, the systems and methods described herein may be performed at least in part on or using a mobile computing device 105.

Mobile computing device 105 includes a mapping module 110, a measuring device 115, and a marking device 120. Mobile computing device 105 may be sized and configured for carrying by a person as part of mapping or creating a layout of a property such as a home. Mapping module 110 collects measurements and marking information from measuring device 115 and marking device 120, respectively. Mapping module 110 may operate to generate a map or layout of the home. In at least some examples, mobile computing device 105 may also be configured to display the map as either a 2-D or 3-D layout of the property. The map may be used for a number of purposes, such as those described above.

While mapping module 110 is shown as a component of mobile computing device 105, other embodiments may include mapping module 110 as a separate module or operational component of environment 100. At least some aspects of mapping module 110 may be performed on other devices such as, for example, a control panel of the home automation system, a back-end server, a third party CAD system, or the like.

Measuring device 115 may operate to collect measurements of the property. The measurements may include measurements of a perimeter of the property. The perimeter measurements may be used to determine an area covered by the property. The perimeter measurement may be taken by the user carrying mobile computing device 105, or at least measuring device 115, around the perimeter of the building. Measurement device 115 may use various technologies including, for example, global positioning system (GPS), a pedometer (e.g., in combination with a direction of travel indication), or the like. The user may physically walk around a perimeter of the property while carrying mobile computing device 105 and/or measuring device 115. The user may begin at a certain location (e.g., at a front door of a house), walk around the perimeter of the property, and end up at the same location where the perimeter measurement began.

Measuring device 115 may also be used to collect measurements of interior spaces of the property. For example, measuring device 115 may be used to measure rooms and other living spaces at least in a two-dimensional horizontal plane (e.g., widths, lengths, depths, etc., between walls or other landmark features of the property). Measuring device 115 may also measure or provide a height measurement in a vertical plane. The vertical and horizontal plane measurements may be used by mapping module 110 to generate the map of the interior of the property. The map may be in the form of a two-dimensional or three-dimensional map, layout, image, rendering, or the like.

Measuring device 115 may operate to collect measurements of the interior of the property using various technologies including, for example, GPS, lasers (e.g., laser diodes), pedometers (e.g., in combination with a direction of travel indication) and the like. Measuring device 115 may be configured as a standalone device (e.g., a handheld computing device). In some examples, measuring device 115 may be mounted to an existing computing device such as, for example, a smart phone, tablet computer, or other type of mobile computing device 105. Measuring device 115 may have different modules, assemblies, or components for use in making the perimeter measurement versus the interior measurements.

Marking device 120 may be used to mark or indicate specific features of the property. For example, marking device 120 may generate a notice or indicator used by mapping module 110 as part of creating the layout. Marking device 120 may be used to mark (e.g., identify a location of) doorways, windows, walls, stairways, fireplaces, lighting fixtures, appliances, computer equipment, plumbing, HVAC components, or other features of the property. Marking device 120 may automatically identify a certain feature to be marked. For example, marking device 120 may include a camera that takes a picture of the feature, identifies the feature in the picture, and properly labels the feature. In another example, a user may manually enter information about the feature of the property as part of generating the marking and/or labeling. The marking information generated by marking device 120 may be delivered or transmitted to mapping module 110. The marking information may be used in combination with the measurements from measuring device 115 to not only generate a layout or map of the property, but also include indicators or markings where certain features of the property are located relative to each other, relative to rooms or other living spaces, landmarks or other features of the property.

Figure 2:
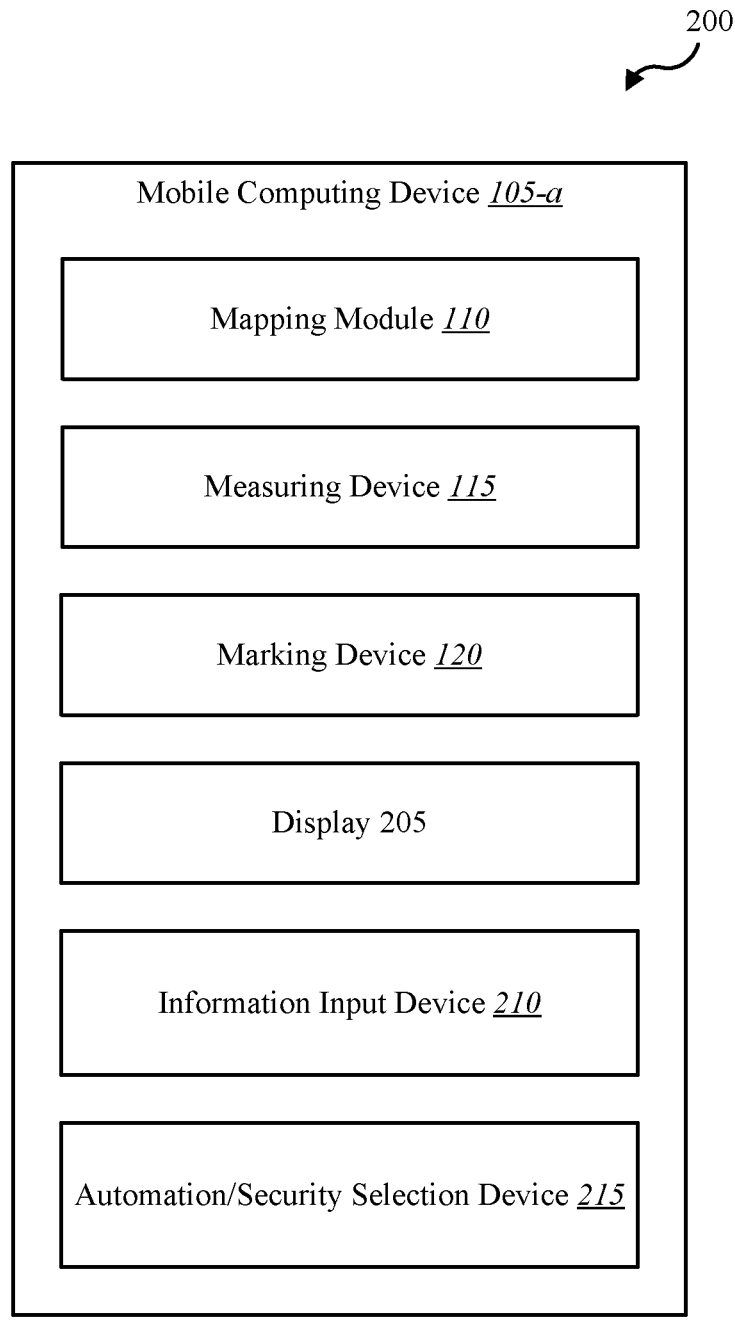
FIG. 2 is a block diagram of another environment in which the present systems and methods may be implemented.

FIG. 2 is a block diagram illustrating one embodiment of an environment 200 in which the present systems and methods may be implemented. Environment 200 may include the same or similar components as discussed above related to environment 100. In some environments, the systems and methods described herein may be formed at least in part on or using mobile computing device 105-a. Mobile computing device 105-a may include, in addition to the mapping module 110, measuring device 115, and marking device 120, a display 205, an information input device 210, and an automation/security selection device 215.

Display 205 may operate to display information collected by mobile computing device 105-a including, for example, measuring information from measuring device 115, and marking information from marking device 120. Display 205 may also display prompts to perform measuring and/or marking functions, the map provided by mapping module 110, instructions, and the like. Display 205 may include, for example, an LCD or LED screen. Display 205 is shown as a component of mobile computing device 105-a. In other embodiments, display 205 may be in communication with mobile computing device 105-a but may be provided separately, such as in conjunction with another device such as another handheld computing device, a desktop computer, a control panel of the home automation system, or the like.

Information input device 210 may receive information from a customer, homeowner, technician, or the like. Information input device 210 may be receptive of information such as, for example, ages of people in a household, numbers of people, pets, environmental conditions, requested level of security and/or automation, cost parameters, and the like. Information entered via information input device 210 may be displayed on display 205. Information input device 210 may include a user interface such as, for example, a touchscreen, a keypad, switches, buttons, and a microphone and/or speakers.

Automation/security selection device 215 may present a number of automation and/or security features available to a customer, homeowner, or technician for use in a home automation system. The automation and/or security features may be recommended based on the map provided by mapping module 110 and information received at information input device 210. The automation and/or security features may be selected based on a number of criteria including, for example, a desired level of automation and/or security, cost considerations, and the like. The recommendations and/or options provided by automation/security selection device 215 may be provided on display 205. User interface may be used in conjunction with automation/security selection device 215 for use by the customer, homeowner, technician or the like to select among the various options and/or recommendations.

Figure 3:
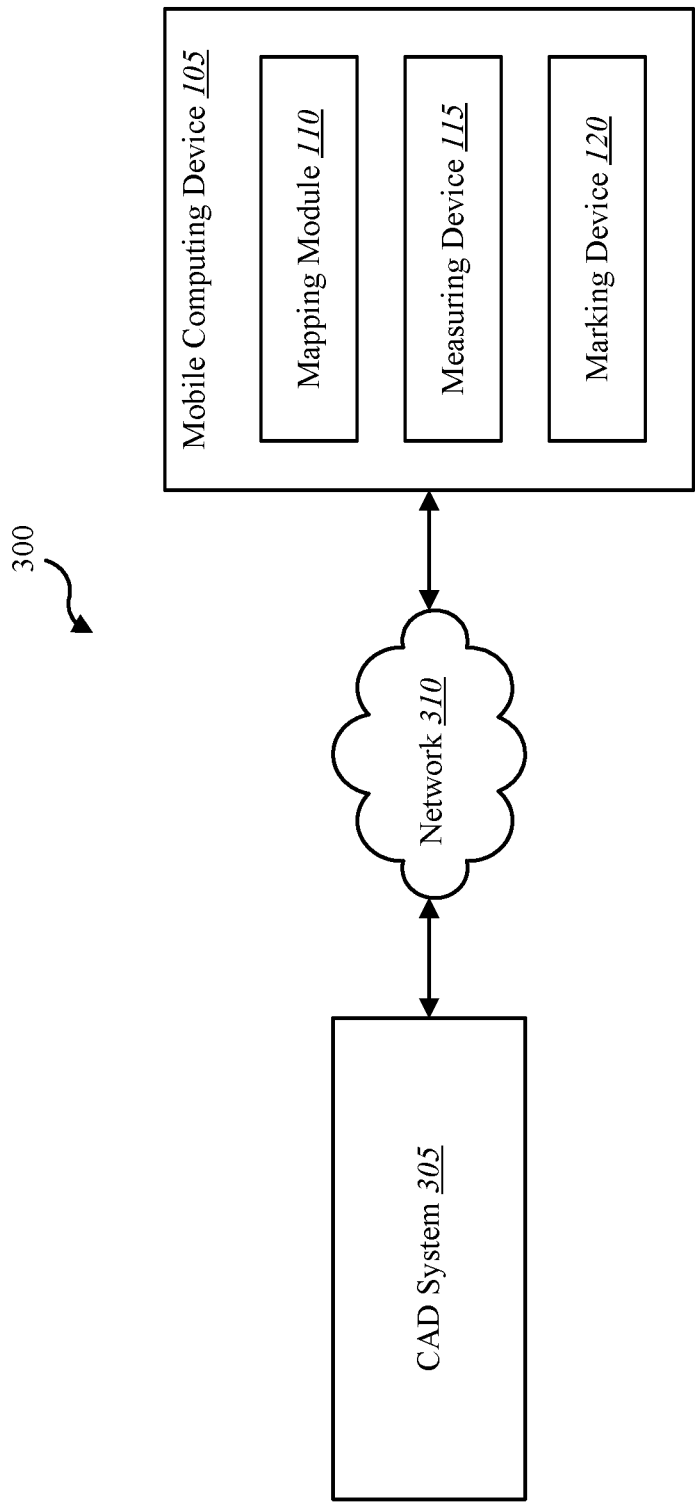
FIG. 3 is a block diagram of another environment in which the present systems and methods may be implemented.

FIG. 3 is a block diagram illustrating one embodiment of an environment 300 in which the present systems and methods may be implemented. Environment 300 may include at least some of the components of environments 100, 200, described above. Environment 300 may include the mobile computing device 105 shown in FIG. 1 and may additionally include a computer-aided design (CAD) system 305 that communicates with mobile computing device 105 via a network 310.

Mapping module 110 may communicate measuring and/or marking information for measuring device 115 and marking device 120 to CAD system 305 for generating the map of the property. CAD system 305 may generate 2-D or 3-D layouts or maps of the property. CAD system 305 may add the markings to the layout. In some examples, the layout generated by CAD system 305 may be delivered to mapping module 110, which then adds the markings from marking device 120. In other examples, the markings from marking device 120 may correlate with preconfigured features. For example, a doorway marking may correspond to a 32 in. wide by 6.5 ft. tall doorway in the layout, whereas a window marking may correlate with a 30 in.×30 in. window in the layout generated by CAD system 305. The features represented by the markings generated by marking device 120 may not be shown in scale in the layout, but may be accurately positioned in at least a horizontal plane and potentially in a vertical plane relative to a floor, wall, or ceiling. While the markings of certain features of the property are described above specifically with reference to the interior measurements of the property, markings may also be made with respect to features positioned along the exterior of the property such as exterior doors, garage doors, windows, and the like.

Mapping module 110 is shown as a separate component from CAD system 305. In some examples, at least some functionality of mapping module 110 is available or operable on CAD system 305. Similarly, CAD system 305, or at least portions thereof, may be operable on or using mapping module 110. In many embodiments, the amount of processing capability and memory required to generate the map is larger than what is possible to be operated on mobile computing device 105. As such, CAD system 305 may be operated as a separate unit or device that is often located remote from mobile computing device 105 and the property being mapped.

Network 310 may utilize any available communication technology such as, for example, Bluetooth, Zigby, Z-wave, infrared (IR), radio frequency (RF), near field communication (NFC), or other short distance communication technologies. In other examples, network 310 may include cloud networks, local area networks (LAN), wide area networks (WAN), virtual private networks (VPN), wireless networks (using 802.11 for example), and/or cellular networks (e.g., using 3G and/or LTE), etc. In some embodiments, network 310 may include the internet.

Figure 4:
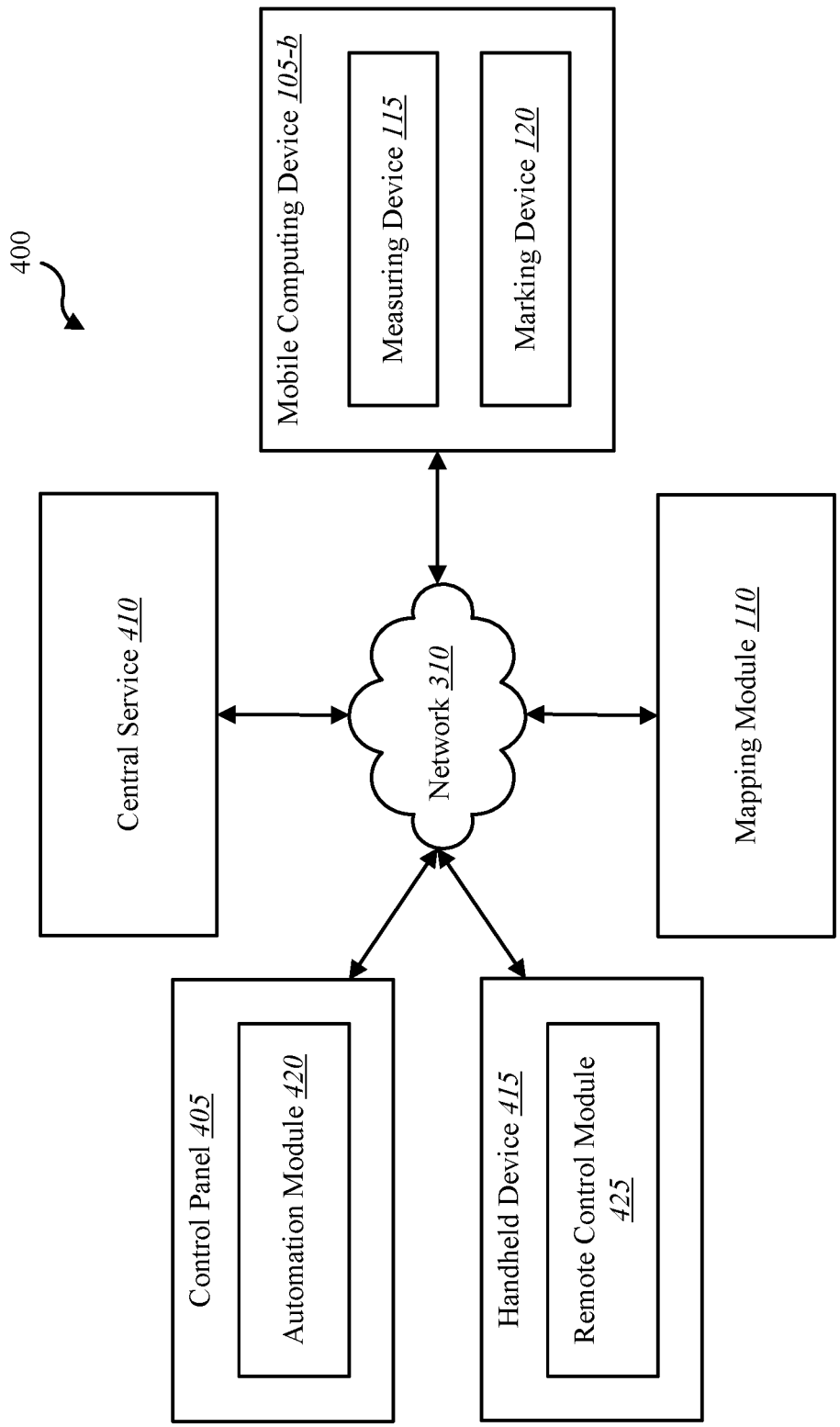
FIG. 4 is a block diagram of another environment in which the present systems and methods may be implemented.

FIG. 4 is a block diagram illustrating one embodiment of an environment 400 in which the present systems and methods may be implemented. Environment 400 may include at least some of the same components of the environment's 100, 200, 300 described above.

Environment 400 includes mobile computing device 105-*b* and mapping module 110 (as described with reference to FIG. 2) and may additionally include a control panel 405, a central service 410, and a handheld device 415. Control panel 405 may include an automation module 420. Handheld device 415 may include a remote control module 425. The components of environment 400 may communicate with each other via network 310.

The map of the property provided by mapping module 110 may be displayed on control panel 405. Control panel 405 may display the map at various times and for different purposes including, for example, showing a physical location on the map of equipment of the home automation system that is activated. In one example, when a user interfaces with control panel 405 when arming security features of the home automation system, control panel 405 may display on the map one or more sensors indicating that a window or door is open. In another example, when an alarm is sounding because an exterior door is opened while the system is armed, control panel 405 may show the location of the open door on the map.

Automation module 420 may operate to automate certain functions of the home automation system and/or the property generally which are under the control of home automation system in response to pre-established criteria and/or learned behavior of users of the property. In one example, automation module 420 automatically turns off lighting or adjusts HVAC setting in portions of the property when users are no longer present in those areas of the property. The location of the users may be determined based at least in part on activities in which the users are engaged (e.g., operating HVAC controls, using appliances in a kitchen, or operating a garage door). In another example, handheld device 415 may provide an identification of the user, and the location of handheld device 415 may be determined at different locations in the home (e.g., via GPS, near field communications, Bluetooth, or the like). For example, if a garage door is activated to be closed and handheld device 415 indicates that the user is away from the property, automation module 420 may automatically shut off lighting, lock doors, adjust an HVAC setting, and arm security features of the home automation system.

Handheld device 415 may include a remote control module 425 that provides some level of control of the home automation system from a remote location (e.g., separate from control panel 405). Remote control module 425 may operate to display the map provided via mapping module 110 as part of providing notices related to operation of home automation system. For example, if an alarm is generated by home automation system, a notice of the alarm may be delivered to handheld device 415. The location of the alarm event may be displayed via remote control module 425 on a map (e.g., a 2-D or 3-D map). Remote control module 425 may permit the user to control, for example, turning off the alarm, operating certain equipment of the home automation system, communicating with central service 410 related to the alarm (e.g., notifying central service 410 that the alarm is a false alarm event), and the like. A picture of certain areas or features of the property may also be displayed in conjunction with display of the map and/or location of the alarm event and/or other notice from equipment of the home automation system. A user may select among a variety of the equipment as indicated on the map that is visible on handheld device 415. Remote control module 425 may provide remote communications and control over that equipment and/or functionality of the equipment. Remote control module 425 may cooperate with control panel 405 as part of providing the remote control functions.

Central service 410 may include a call center, customer service, backup storage, and other services and functions in support of the home automation system. Central service 410 may include a copy of the map of the property along with markings for the equipment of the home automation system and other features of the property. A service call from central service 410 to the user (e.g., via control panel 405, handheld device 415, a landline, etc.) may include reference to the specific location on a property based on the map. Central service 410 may communicate specific location information based on the map to third parties such as, for example, maintenance personnel, first responders, and the like. In one example, a glass break sensor may indicate that a master bedroom window is broken at 1:00 p.m. Control panel 405 may determine that no one is home based on, for example, identification information available via handheld devices 415 and/or inactivity determined via other sensors within the home. Control panel 405 may notify central service 410 of the glass break. Central service 410 may reach out to the homeowner via handheld device 415 and may concurrently reach out to a police department with an alarm. The user may receive information from central service 410 via handheld device 415 including, for example, a specific location of the glass break as shown on the map. A picture may be associated with that window and may be selected via, for example, the map. The user may also access a video camera feed via handheld device 415 that shows the window where the glass break notification was generated. The video feed may show that the window is in proper order and that the glass break alarm is a false alarm. The user may turn off the alarm condition at control panel 405 via remote control module 425. The user may also notify central service 410 that the alarm is a false alarm. Central service 410 may notify the police and/or other entities of the false alarm.

Figure 5:
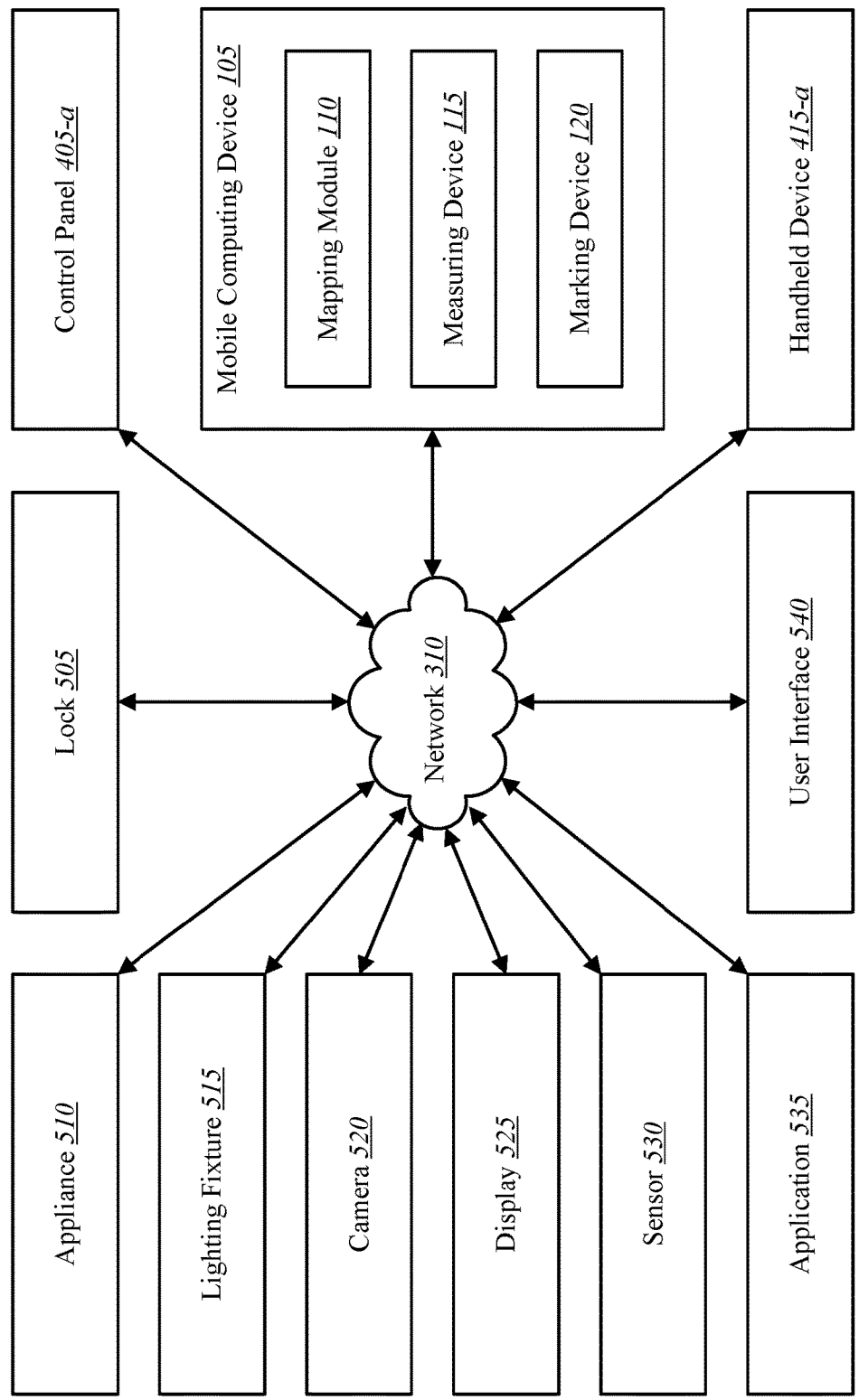
FIG. 5 is a block diagram of another environment in which the present systems and methods may be implemented.

FIG. 5 is a block diagram illustrating one embodiment of an environment 500 in which the present systems and methods may be implemented. Environment 500 may include at least some of the same components of the environments 100, 200, 300, 400 described above. Environment 500 includes mobile computing device 105, which includes mapping module 110, measuring device 115, and marking device 120. Environment 500 may further include control panel 405-*a* and handheld device 415-*a*. Environment 500 may additionally include lock 505, appliance 510, lighting fixture 515, camera 520, display 525, sensor 530, application 535, and user interface 540. In some embodiments, control panel 405-*a* may include an automation module 420, and handheld device 415-*a* may include remote control module 425.

The components shown in environment 500 that are not included in environments 100, 200, 300, 400 described above may be additional components of a home automation system. At least some of these additional components of a home automation system may be used in cooperation with one or all of the mobile computing device 105, control panel 405-*a*, and handheld device 415-*a*. For example, the map of the property provided by mapping module 110 may be populated with at least some of the additional components and displayed for a user at control panel 405-*a* and/or handheld device 415-*a*. In one example, the map includes markings for one or more locks 505, appliances 510, lighting fixtures 515, cameras 520, displays 525, and/or sensors 530.

The home automation system (e.g., via control panel 405-*a*) may automatically operate any one of these additional components based at least in part on predetermined criteria, behavior, or proximity of one or more users as determined at least in part using the map. Additionally, or alternatively, some of these additional components may be used in cooperation with the map to provide additional information for a user, maintenance personnel, call center personnel, and the like in an alarm event. In one example, if an alarm event indicates opening of a door of the property at an unauthorized time, the user may, via handheld device 415-*a*, confirm the status of a lock 505 of the door and/or view the door via camera 520 to confirm the state of the door. Sensor 530 may be a motion detector that confirms whether an object is moving in the vicinity of the door which may confirm that a person opened the door and is present in the living space.

Sensor 530 may include, for example, a camera sensor, an audio sensor, a forced entry sensor, a shock sensor, a proximity sensor, a boundary sensor, an appliance sensor, a light fixture sensor, a temperature sensor, a light beam sensor, a three-dimensional (3-D) sensor, a motion sensor, a smoke sensor, a glass break sensor, a door sensor, a video sensor, a carbon monoxide sensor, an accelerometer, a global positioning system (GPS) sensor, a Wi-Fi positioning sensor, a capacitance sensor, a radio frequency sensor, a near-field sensor, a heartbeat sensor, a breathing sensor, an oxygen sensor, a carbon dioxide sensor, a brainwave sensor, a voice sensor, a touch sensor, and the like. Control panel 405-*a* may include one or more of sensors 530. Although sensor 530 is depicted as a separate component from control panel 405-*a*, in some embodiments, sensor 530 may be connected directly to any one of the components of environment 500. Additionally, or alternatively, sensor 530 may be integrated into a home appliance or fixture.

Application 535 may allow a user (e.g., a user interfacing directly with control panel 405-*a* located at a property being monitored by the home automation system) to control, either directly or via control panel 405-*a* and/or a separate computing device, an aspect of the monitored property including, for example, security, energy management, locking and unlocking doors, checking the status of the doors, locating a user or item, controlling lighting, thermostat, or cameras and receiving notifications regarding a current status or anomaly associated with a home, office, place of business, or the like (e.g., a property). In some configurations, application 535 may enable control panel 405-*a* to communicate with mobile computing device 105, lock 505, appliance 510, lighting fixture 515, camera 520, display 525, sensor 530, user interface 540, or handheld device 415-*a*, as well as other devices or systems. In one example, application 535 may provide the user interface 540 to display an automation, security, and/or energy management content on control panel 405-*a*. Thus, application 535, via user interface 540, may allow users to control aspects of their home, office, and/or other type of property, as well as control generation, delivery, and responses to messages. Further, application 535 may be installed on control panel 405-*a* or other components and/or features of the home automation system. Control panel 405-*a* may carry out at least some functionality of mapping module 110 and/or mobile computing device 105. For example, application 535 may provide two-way communication between mapping module 110 and/or mobile computing device 105, or delivery of a message from mapping module 110 to another location (e.g., handheld device 415-*a*), and the like.

Figure 6:
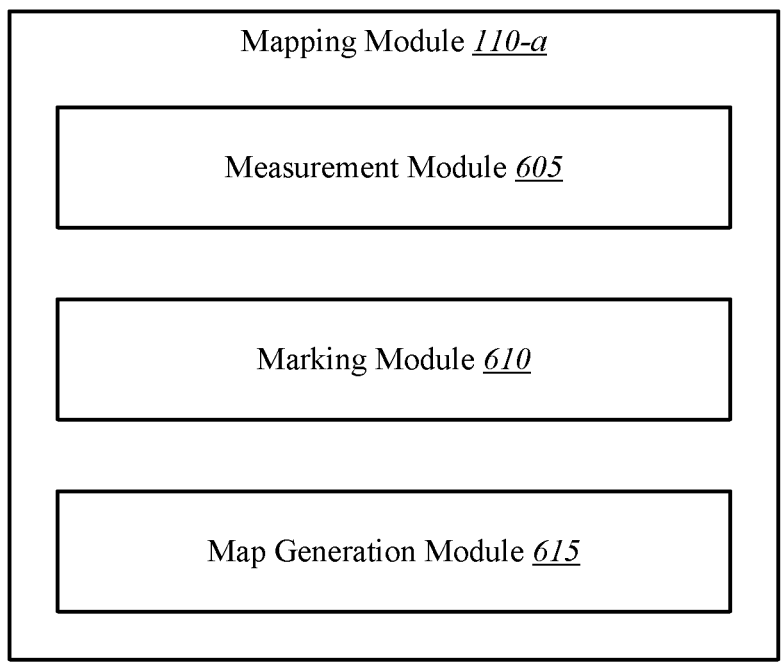
FIG. 6 is a block diagram of a mapping module for use with the environments of FIGS. 1-5.

FIG. 6 is a block diagram illustrating an example mapping module 110-*a*. Mapping module 110-*a* may be one example of the mapping module 110 described above with reference to FIGS. 1-5. Mapping module 110-*a* includes a measurement module 605, a marking module 610, and a map generation module 615.

Measurement module 605 may cooperate with the measuring device 115 of mobile computing device 105 described above with reference to FIGS. 1-5. Measurement module 605 may utilize any one of a plurality of measuring technologies to collect measurements of a property (e.g., an outer perimeter, an area, and interior boundaries and/or living spaces of the property). Measurement module 605 may operate to provide instructions, prompts for information, and functions as part of interfacing with a user to collect measurements. Measurement module 605 may operate to, for example, store the measurement information, aggregate the measurement information, and provide other processing related to the measurements.

Marking module 610 may cooperate, for example, with the measuring device 115 of mobile computing device 105 described with reference to FIGS. 1-5. Marking module 610 may cooperate with any of a number of different technologies to provide markings or labeling of features of a property. Marking module 610 may distinguish between exterior and interior markings or labels. The markings or labels may coincide with various measurements collected via measurement module 605. For example, a particular marking generated by marking module 610 may include a height, width, or linear depth measurement and/or location relative to other features of the property. The markings may be provided in different categories. For example, one category may relate to specific physical features of the property such as doors, windows, bedrooms, stairwells, and the like. Other categories may include appliances, lighting fixtures, locks, security and/or automation equipment, and the like.

Map generation module 615 may operate to generate a map or layout of a property based at least in part on information received from measurement module 605 and/or marking module 610. Map generation module 615 may be operable to generate 2-D or 3-D maps. In some embodiments, map generation module 615 may include a computer-aided design (CAD) software or system that operates to generate the map. Map generation module 615 may communicate with other software systems provided locally or remotely for generating all or portions of the map. In some examples, a remotely located CAD system is used to generate at least a portion of the map. Map generation module 615 may communicate with the remote CAD system including, for example, to provide measurement and marking information. Map generation module 615 may also operate to display a map of the property on the mobile computing device 105 or other display (e.g., control panel 405, central service 410, or handheld device 415 described above). Map generation module 615 may populate a layout or map of the property with other information including, for example, the markings from marking module 610, photographs of certain portions of the property (e.g., components or portions of the property corresponding to a given marking), and the like.

Figure 7:
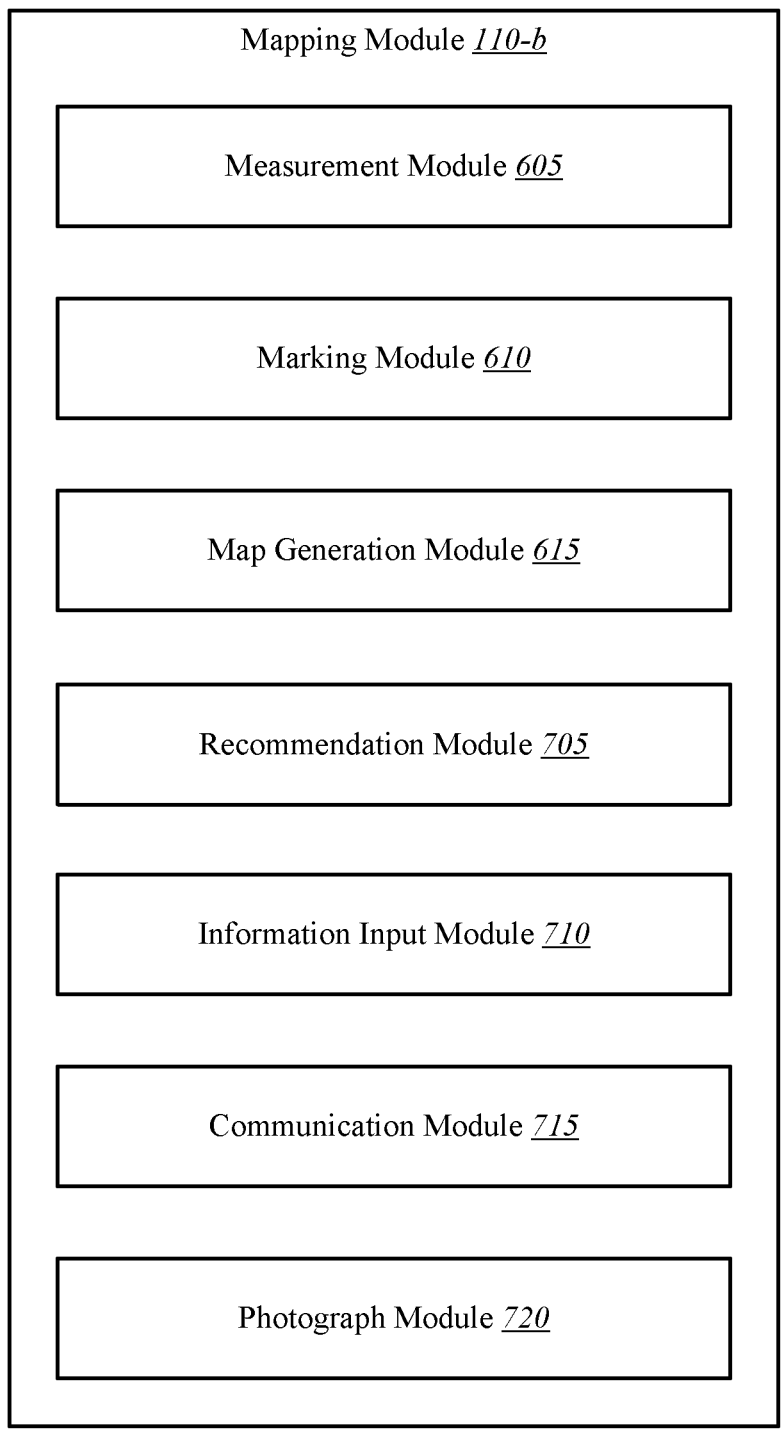
FIG. 7 is a block diagram of another mapping module for use with the environments of FIGS. 1-5.

FIG. 7 is a block diagram illustrating an example mapping module 110-b. Mapping module 110-b may be one example of the mapping module 110 described above with reference to FIGS. 1-5. Mapping module 110-b may include, in addition to measurement module 605, marking module 610, and map generation module 615, a recommendation module 705, an information input module 710, a communication module 715, and a photograph module 720.

Recommendation module 705 may operate to generate recommendations for automation and/or security equipment based on a generated map of and/or other information related to the property. Recommendation module 705 may generate the recommendations based on a number of criteria including, for example, the size of the property, the design of the property, pricing criteria, and the like. Information input module 710 may operate to receive various input from the property owner (customer), a technician, and other sources. The information received via information input module 710 may include, for example, preferences for the level of automation and/or security from the customer, numbers and ages of occupants of the property, activity level of user on the property, safety and security of the area in which the property resides, and the like. The information gathered via information input module 710 may be provided to recommendation module 705 as part of generating the recommended automation and/or security equipment.

Recommendation module 705 may also recommend placement of the equipment on the property. The customer may select any or all of the recommendations and may further customize the automation and security features. The map may be modified to show all of the recommended features and/or selected features by the customer. The map, as populated with the equipment and additionally the markings, may be saved for use by others (e.g., an installer, maintenance personnel, emergency personnel, the homeowner on a handheld device, and/or call center personnel).

Communication module 715 may operate to communicate information from mapping module 110-b to other sources. For example, communication module 715 may distribute the completed map with agreed upon equipment to third parties or the customer. Communication module 715 may communicate information in a variety of ways including, for example, via a network (e.g., network 310), a display, via email or text message, and the like.

Photograph module 720 may operate to generate photographs of certain features of the property. Additionally, or alternatively, photograph module 720 may receive photographs from other sources and populate the map with the photos. Photograph module 720 may generate or otherwise handle video footage as well as still shot photographs.

Figure 8:
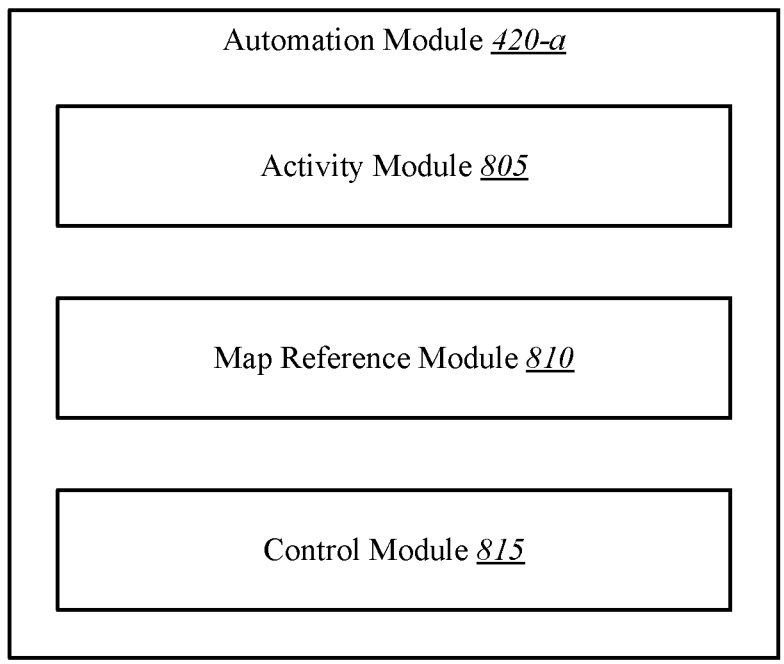
FIG. 8 is a block diagram of an automation module for use with at least the environment of FIG. 4.

FIG. 8 is a block diagram illustrating an example automation module 420-a. Automation module 420-a may be one example of the automation module 420 described above with reference to FIG. 4. Automation module 420-a may include an activity module 805, a map reference module 810, and a control module 815.

Activity module 805 may monitor activities and/or behavior of one or more persons on the property. The monitoring of activities may include, for example, determining on/off states of various lighting fixtures, appliances and the like, power consumption in certain areas of the property, operation of doors, locks, windows, etc., operation of an HVAC system, and the like. Individual users may be identified via activity module 805 by a pin code entered as part of operating certain features of the home automation system. Additionally, or alternatively, individuals may be identified based on a unique identifying device carried by the user (e.g., a key fob or an app operating on a mobile computing device carried by the user). Activity module 805 may determine not only particular activities at any given time, but also may establish patterns of behavior.

Map reference module 810 may operate to reference the map provided by mapping module 110 described above. Map reference module 810 may reference the map, including marked features on the map, in comparison to where certain activity is occurring as determined via activity module 805. For example, if activity module 805 determines that the only user in the home is located in the garage, automation module 420-a may be able to determine by reference to the map via map reference module 810 that features, components or other functions in other areas of the property may be automatically adjusted for improved efficiency, security, automation, and the like.

Control module 815 may operate to control certain features, equipment or functions in the property based on the determined activity via activity module 805 and the specific locations determined via map reference module 810. Control module 815 may automatically perform functions such as, for example, turning on/off security features, turning on/off lighting or appliances, operating an HVAC system, and communicating with third parties or remotely located users. Utilization of the map generated or otherwise provided by mapping module 110 described herein may provide additional detail and certainty as to the automatic capabilities provided via control module 815.

Figure 9:
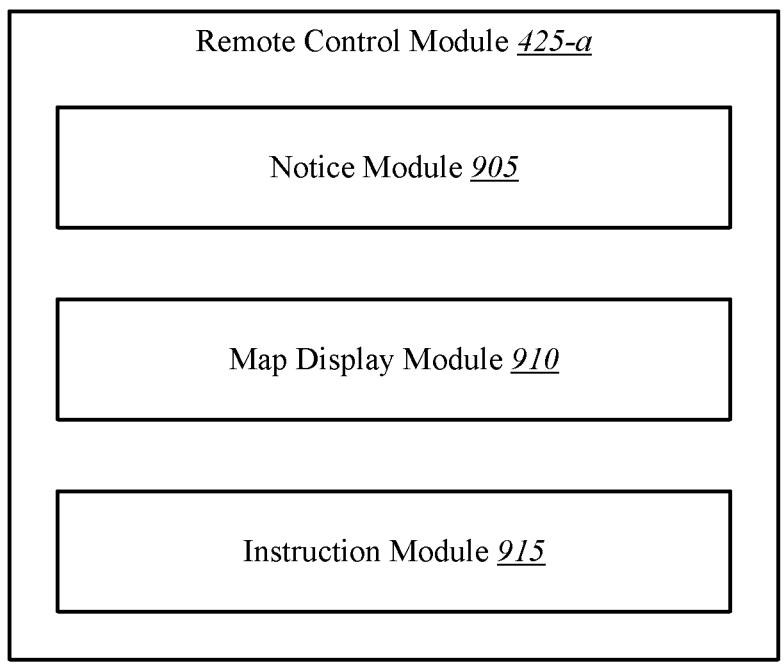
FIG. 9 is a block diagram of an remote control module for use with at least the environment of FIG. 4.

FIG. 9 is a block diagram illustrating an example remote control module 425-*a*. Remote control module 425-*a* may be one example of the remote control module 425 described above with reference to FIG. 4. Remote control module 425-*a* includes a notice module 905, a map display module 910, and an instruction module 915. Remote control module 425-*a* is shown in FIG. 4 being operable by or integrated into a handheld device 415. Other embodiments are possible in which remote control module 425-*a* is operable by or included in other components or features such as, for example, central service 410 or mobile computing device 105-*b*.

Notice module 905 may operate to generate notices to or from a remote location. The notices may be generated by one or more automation and security features on a property. Additionally, or alternatively, the notice may be in the form of a prompt to update or add features, functionality, criteria, and the like associated with automation and/or security equipment at the property, or other features and functions of the property.

Map display module 910 may operate to display a map on a remotely located computing device. Map display module 910 may display a map, inclusive of, for example, markings of physical features of the property, locations and identifiers of automation and/or security features located on the property, photographs, video content, and the like. Map display module 910 may separately display each of a plurality of floor plans for the property. Map display module 910 may be operable to illustrate 2-D or 3-D maps or layouts, including 3-D renderings of a given floor or living area of the property.

Instruction module 915 may operate to permit a remotely located user to provide instructions associated with the property, the automation and/or security features of the property, and other functions or features of the property. For example, instruction module 915 may include a text message, on/off function, setting adjustment, or the like for controlling features or functions of the home automation system. Instruction module 915 may additionally, or alternatively, provide instructions to a third party such as a central service 410, another remotely located user of the property, or directly with a control panel of the home automation system.

Figure 10:
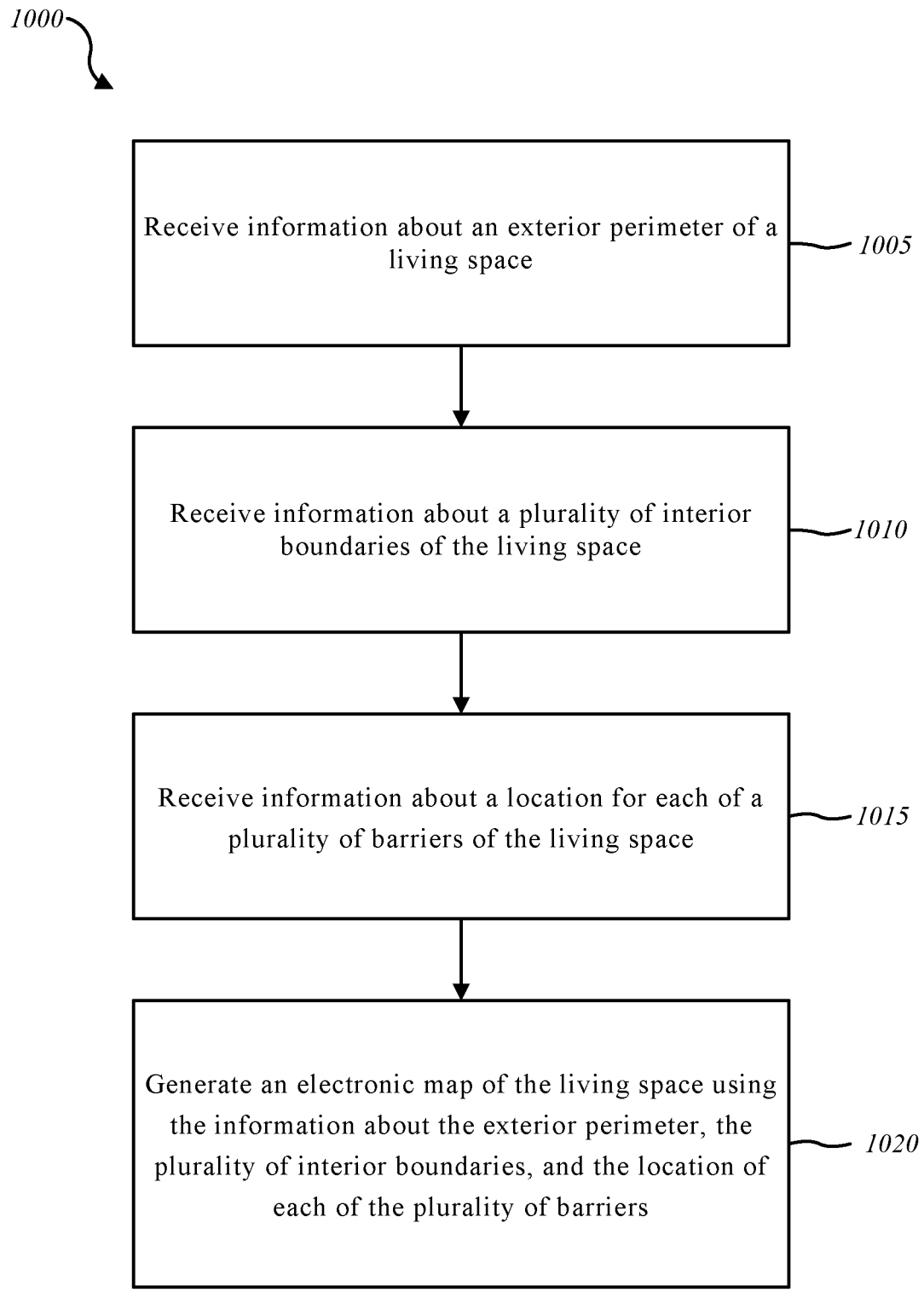
FIG. 10 is a flow diagram illustrating a method for mapping a living space in accordance with the present systems and methods.

FIG. 10 is a flow diagram illustrating one embodiment of a method 1000 for mapping a living space. In some configurations, the method 1000 may be implemented by the mapping module 110 shown and described with reference to FIGS. 1-7. In other examples, the method 1000 may be performed generally by mobile computing device 105 shown in FIGS. 1-5, or even more generally by environments 100, 200, 300, 400, 500 shown in FIGS. 1-5.

At block 1005, the method 1000 includes receiving information about an exterior perimeter of the living space. Block 1010 includes receiving information about a plurality of interior boundaries of the living space. Block 1015 includes receiving information about a location for each of a plurality of barriers of a living space. Block 1020 includes generating an electronic map of the living space using the information about the exterior perimeter, the plurality of interior boundaries, and the location of each of the plurality of barriers.

The information about the exterior perimeter, the plurality of interior boundaries, and the location of each of the plurality of barriers may be received from a handheld mobile computing device. The information about the plurality of interior boundaries may include three-dimensional information about each of the plurality of interior boundaries. The plurality of barriers may include doors and windows. The plurality of interior boundaries may include interior walls of the living space. The living space may be at home, and the exterior perimeter may include exterior walls of the home and the plurality of interior boundaries may be interior walls defining rooms of the home. The method 1000 may also include generating recommended automation features, or security features, or a combination thereof, based on the electronic map of the living space.

Figure 11:
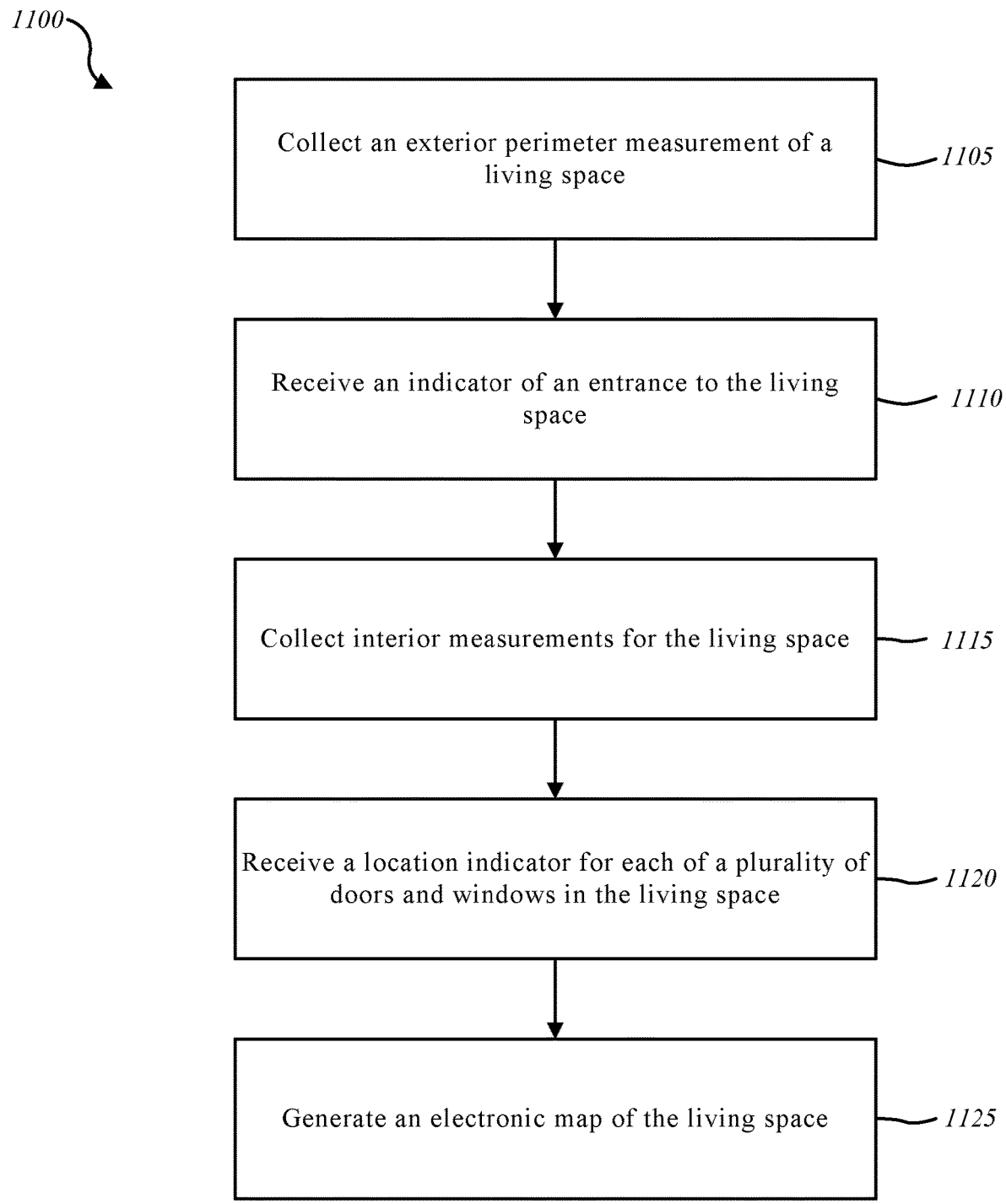
FIG. 11 is a flow diagram illustrating another method for mapping a living space in accordance with the present systems and methods.

FIG. 11 is a flow diagram illustrating one embodiment of a method 1100 for mapping a living space. In some configurations, the method 1100 may be implemented by the mapping module 110 shown and described with reference to FIGS. 1-7. In other examples, the method 1100 may be performed generally by mobile computing device 105 shown in FIGS. 1-5, or even more generally by environments 100, 200, 300, 400, 500 shown in FIGS. 1-5.

At block 1105, the method 1100 includes collecting an exterior perimeter measurement of the living space. Block 1110 includes receiving an indicator of an entrance to the living space. Block 1115 includes collecting interior measurements for the living space. Block 1120 includes receiving a location indicator for each of the plurality of doors and windows of the living space. Block 1125 includes generating an electronic map of the living space.

The electronic map may be a three-dimensional map of the living space. The method 1100 may include generating recommended security and automation features for the living space based at least in part on the electronic map.

Figure 12:
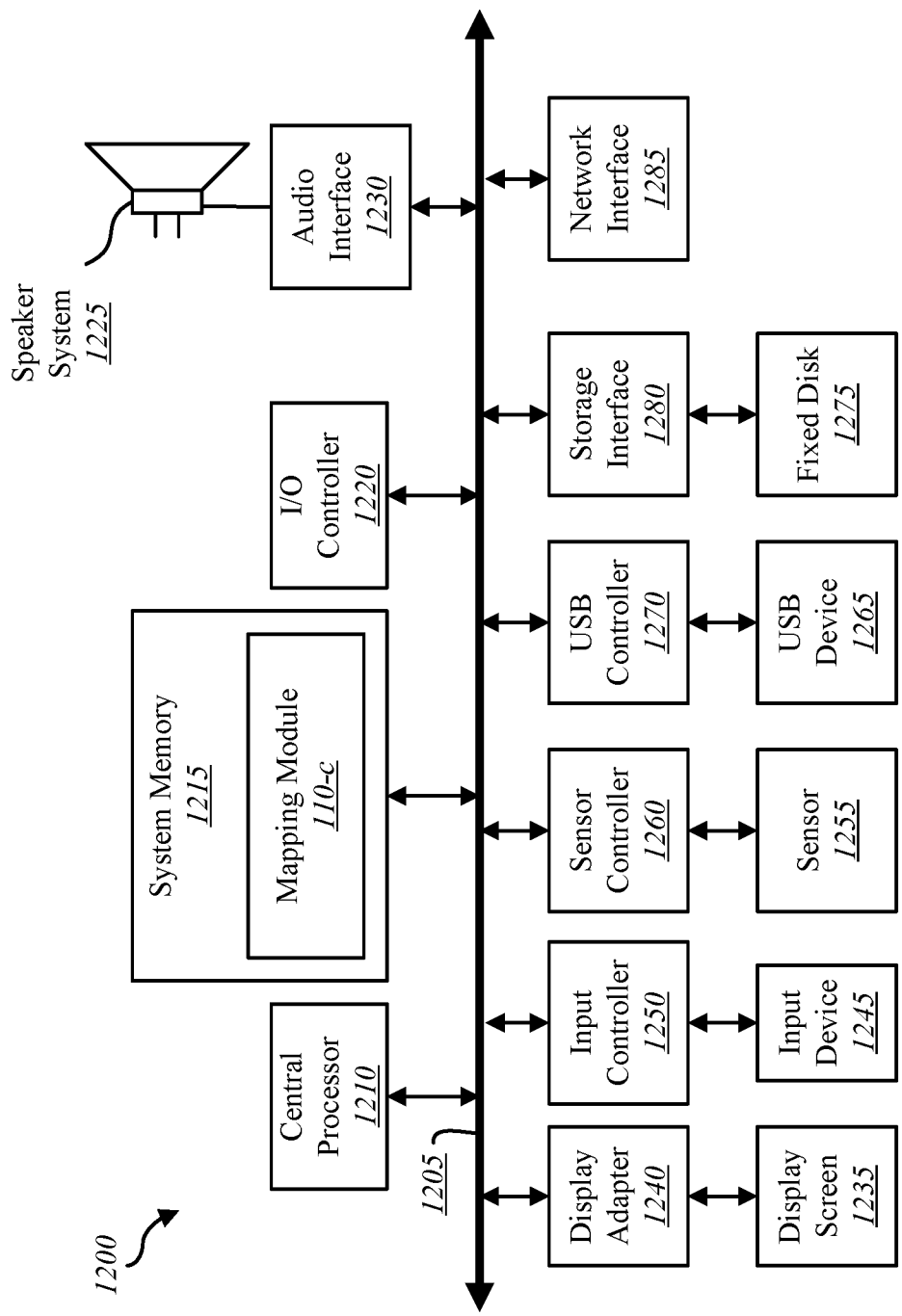
FIG. 12 is a block diagram of a computer system suitable for implementing the present systems and methods of FIGS. 1-11.

FIG. 12 depicts a block diagram of a controller 1200 suitable for implementing the present systems and methods. Controller 1200 may include, for example, the mobile computing device 105 described with reference to FIGS. 1-5. In one configuration, controller 1200 includes a bus 1205 which interconnects major subsystems of controller 1200, such as a central processor 1210, a system memory 1215 (typically RAM, but which may also include ROM, flash RAM, or the like), an input/output controller 1220, an external audio device, such as a speaker system 1225 via an audio output interface 1230, an external device, such as a display screen 1235 via display adapter 1240, an input device 1245 (e.g., remote control device interfaced with an input controller 1250), multiple USB devices 1265 (interfaced with a USB controller 1270), and a storage interface 1280. Also included are at least one sensor 1255 connected to bus 1205 through a sensor controller 1260 and a network interface 1285 (coupled directly to bus 1205).

Bus 1205 allows data communication between central processor 1210 and system memory 1215, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components or devices. For example, the mapping module 110-*c* to implement the present systems and methods may be stored within the system memory 1215. Applications resident with controller 1200 are generally stored on and accessed via a non-transitory computer readable medium, such as a hard disk drive (e.g., fixed disk drive 1275) or other storage medium. Additionally, applications can be in the form of electronic signals modulated in accordance with the application and data communication technology when accessed via network interface 1285.

Storage interface 1280, as with the other storage interfaces of controller 1200, can connect to a standard computer readable medium for storage and/or retrieval of information, such as a fixed disk drive 1275. Fixed disk drive 1275 may be a part of controller 1200 or may be separate and accessed through other interface systems. Network interface 1285 may provide a direct connection to a remote server via a direct network link to the Internet via a POP (point of presence). Network interface 1285 may provide such connection using wireless techniques, including digital cellular telephone connection, Cellular Digital Packet Data (CDPD) connection, digital satellite data connection, or the like. In some embodiments, one or more sensors (e.g., motion sensor, smoke sensor, glass break sensor, door sensor, window sensor, carbon monoxide sensor, and the like) connect to controller 1200 wirelessly via network interface 1285.

Many other devices or subsystems (not shown) may be connected in a similar manner (e.g., entertainment system, computing device, remote cameras, wireless key fob, wall mounted user interface device, cell radio module, battery, alarm siren, door lock, lighting system, thermostat, home appliance monitor, utility equipment monitor, and so on). Conversely, all of the devices shown in FIG. 12 need not be present to practice the present systems and methods. The devices and subsystems can be interconnected in different ways from that shown in FIG. 12. The aspect of some operations of a system such as that shown in FIG. 12 are readily known in the art and are not discussed in detail in this application. Code to implement the present disclosure can be stored in a non-transitory computer-readable medium such as one or more of system memory 1215 or fixed disk drive 1275. The operating system provided on controller 1200 may be iOS®, ANDROID®, MS-DOS®, MS-WINDOWS®, OS/2®, UNIX®, LINUX®, or another known operating system.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments of the present systems and methods may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

Furthermore, while various embodiments have been described and/or illustrated herein in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may configure a computing system to perform one or more of the exemplary embodiments disclosed herein.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present systems and methods and their practical applications, to thereby enable others skilled in the art to best utilize the present systems and methods and various embodiments with various modifications as may be suited to the particular use contemplated.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising." In addition, the term "based on" as used in the specification and the claims is to be construed as meaning "based at least upon."

What is claimed is:

1. A method for a control panel of an automation or security system, comprising:
    receiving, from a handheld computing device, an electronic map of a home comprising a layout of the home;
    generating a recommended automation or security system layout based at least in part on receiving the electronic map and one or more criteria;
    determining an activation of an automation or security feature of the recommended automation or security system layout;
    receiving a location of the activated automation or security feature of the recommended automation or security system layout relative to the layout of the home; and displaying the electronic map of the home based at least in part on determining the activation of the automation or security feature, the electronic map of the home, and the location of the activated automation or security feature at the location of the automation or security feature relative to the layout of the home.

2. The method of claim 1, further comprising:
displaying a video camera feed of the automation or security feature in conjunction with the electronic map of the home, wherein displaying the video camera feed of the automation or security feature is based at least in part on determining the activation of the automation or security feature.

3. The method of claim 2, further comprising:
receiving, from a user input, a verification of an occurrence of the activation of the automation or security feature of the recommended automation or security system layout based at least in part on the displaying the video camera feed of the automation or security feature.

4. The method of claim 1, further comprising:
receiving, from the automation or security feature, an indication of an event related to the automation or security feature; and
determining that the event is an unauthorized event, wherein determining the activation of the automation or security feature is based at least in part on determining that the event is the unauthorized event.

5. The method of claim 1, wherein generating the recommended automation or security system layout further comprises:
generating recommended automation or security features based at least in part on the electronic map and the one or more criteria.

6. The method of claim 1, wherein the one or more criteria comprises one or more of a size of the home, a pricing criterion, a user preference for a level of automation or security of the home, an activity level of the a at the home, or a security level of an area surrounding the home.

7. The method of claim 1, further comprising:
transmitting a notification of the activation of the automation or security feature to a third party, wherein the notification comprises the electronic map of the home and the location of the activated automation or security feature at the location of the automation or security feature relative to the layout of the home.

8. The method of claim 7, wherein the third party includes maintenance personnel, call center personnel, or emergency personnel.

9. The method of claim 1, further comprising:
transmitting a notification of the activation of the automation or security feature to a user device, wherein the notification comprises the electronic map of the home and the location of the activated automation or security feature at the location of the automation or security feature relative to the layout of the home.

10. The method of claim 9, further comprising:
receiving a communication from the user device based at least in part on transmitting the notification to the user device, the communication configured to verify an occurrence of the activation of the automation or security feature.

11. The method of claim 9, further comprising:
receiving a communication from the user device based at least in part on transmitting the notification to the user device, the communication configured to control the automation or security feature.

12. The method of claim 1, wherein the automation or security feature includes a door, a window, a lock, an appliance, a lighting fixture, a camera, a sensor, or a combination thereof.

13. The method of claim 1, wherein the control panel of the security or automation system is a wall-mounted control panel located at the home.

14. A control panel for automation or security systems, comprising:
a processor;
a memory in electronic communication with the processor; and
instructions stored in the memory, the instructions being executable by the processor to:
receive, from a handheld computing device, an electronic map of a home comprising a layout of the home;
generate a recommended automation or security system layout based at least in part on receiving the electronic map and one or more criteria;
determine an activation of an automation or security feature of the recommended automation or security system layout;
receive a location of the activated automation or security feature of the recommended automation or security system layout relative to the layout of the home; and
display the electronic map of the home based at least in part on determining the activation of the automation or security feature, the electronic map of the home, and the location of the activated automation or security feature at the location of the automation or security feature relative to the layout of the home.

15. The control panel of claim 14, wherein the instructions are further executable to:
display a video camera feed of the automation or security feature in conjunction with the electronic map of the home, wherein displaying the video camera feed of the automation or security feature is based at least in part on determining the activation of the automation or security feature.

16. The control panel of claim 15, wherein the instructions are further executable to:
receive, from a user input, a verification of an occurrence of the activation of the automation or security feature of the recommended automation or security system layout based at least in part on the displaying the video camera feed of the automation or security feature.

17. The control panel of claim 14, wherein the instructions are further executable to:
receive, from the automation or security feature, an indication of an event related to the automation or security feature; and
determine that the event is an unauthorized event, wherein determining the activation of the automation or security feature is based at least in part on determining that the event is the unauthorized event.

18. The control panel of claim 14, wherein the instructions to generate the recommended automation or security system layout are further executable to:
generate recommended automation or security features based at least in part on the electronic map and the one or more criteria.

19. The control panel of claim 14, wherein the one or more criteria comprises one or more of a size of the home, a pricing criterion, a user preference for a level of automation or security of the home, an activity level of the a at the home, or a security level of an area surrounding the home.

20. A non-transitory computer-readable medium storing instructions executable by a processor of a control panel to:
receive, from a handheld computing device, an electronic map of a home comprising a layout of the home;
generate a recommended automation or security system layout based at least in part on receiving the electronic map and one or more criteria;
determine an activation of an automation or security feature of the recommended automation or security system layout;
receive a location of the activated automation or security feature of the recommended automation or security system layout relative to the layout of the home; and
display the electronic map of the home based at least in part on determining the activation of the automation or security feature, the electronic map of the home, and the location of the activated automation or security feature at the location of the automation or security feature relative to the layout of the home.

* * * * *